United States Patent
Oohara et al.

(10) Patent No.: US 6,713,403 B2
(45) Date of Patent: Mar. 30, 2004

(54) METHOD FOR MANUFACTURING SEMICONDUCTOR DEVICE

(75) Inventors: Junji Oohara, Nisshin (JP); Kazuhiko Kano, Toyoake (JP); Hiroshi Muto, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/384,562

(22) Filed: Mar. 11, 2003

(65) Prior Publication Data

US 2003/0176006 A1 Sep. 18, 2003

(30) Foreign Application Priority Data

Mar. 18, 2002 (JP) ......................... 2002-073960

(51) Int. Cl.[7] ................. H01L 21/00; H01L 21/302; B44C 1/22
(52) U.S. Cl. ................. 438/710; 438/739; 438/52; 216/37; 216/59; 216/62; 216/67
(58) Field of Search ............. 438/52–53, 710, 438/739; 216/37, 59, 62, 66, 67

(56) References Cited

U.S. PATENT DOCUMENTS

| | | |
|---|---|---|
| 6,151,966 A | 11/2000 | Sakai et al. |
| 6,187,685 B1 * | 2/2001 | Hopkins et al. ............ 438/710 |
| 6,365,056 B1 | 4/2002 | Robert et al. |
| 6,399,516 B1 | 6/2002 | Ayon |

* cited by examiner

*Primary Examiner*—John Niebling
*Assistant Examiner*—Viktor Simkovic
(74) *Attorney, Agent, or Firm*—Posz & Bethards, PLC

(57) ABSTRACT

A method for manufacturing a semiconductor device having a movable unit includes a step of forming an SOI substrate that includes a semiconductor substrate, an insulating layer, and a semiconductor layer. The method further includes a step of dry etching the semiconductor layer to form a trench and a step of dry etching a sidewall defining the trench at a portion adjacent to a bottom of the trench to form the movable unit. The later dry etching is implemented with a charge building up on a surface of the insulating layer that is exposed during the former dry etching to etch the portion. In addition, the later dry etching is implemented at an etching rate higher than that at which the former dry etching is implemented to reduce the deposition amount of a protection film deposited on a reverse side of the movable unit during the later dry etching.

1 Claim, 3 Drawing Sheets

METHOD FOR MANUFACTURING SEMICONDUCTOR DEVICE

CROSS REFERENCE TO RELATED APPLICATION

This application relates to and incorporates herein by reference Japanese Patent Application No. 2002-73960 filed on Mar. 18, 2002.

BACKGROUND OF THE INVENTION

The present invention relates to a method for manufacturing a semiconductor device, in which an active layer is located on a supporting substrate with an insulating intermediate layer therebetween and a movable unit included in the active layer moves in relation to the supporting substrate in response to a force applied to the movable unit, which is correlated to a dynamic quantity to be measured by the device.

Such a device is proposed in JP-A-11-274142. As shown in FIG. 1, the proposed device 100 includes a substrate 1 that has a Silicon-On-Insulator (SOI) structure. The substrate 1 is composed of an active layer 1C, an insulating intermediate layer 1B, and a supporting substrate 1A. The active layer 1C and the supporting substrate 1A are made of silicon, and the insulating intermediate layer 1B is made of silicon oxide. The active layer 1C includes a movable unit 2. The movable unit 2 moves in relation to the supporting substrate 1A in response to a force applied to the movable unit 2. The force is correlated to a dynamic quantity to be measured by the device 100.

In the manufacturing process of the proposed device 100, a plurality of trenches 4 that extend through a silicon layer, from which the active layer 1C is formed, to the insulating intermediate layer 1B are formed by dry etching the silicon layer. Then, the sidewalls defining the trenches 4 are dry etched at the portions adjacent to the bottoms of the trenches 4 with a charge building up on the surface of the insulating layer 1B. The charge changes the trajectory angle of the etching ions, so the etching ions strike the sidewalls and locally etch the sidewalls defining the trenches 4 at the portions adjacent to the bottoms of the trenches to complete the movable unit 2.

However, according to the study conducted by the inventor of the present invention, when the movable unit 2 is completed by locally etching the sidewalls defining the trenches 4, jagged protrusions 3 are occasionally formed at a reverse side of the movable unit 2, at which the movable unit 2 face the insulating layer 1B. The local etching of the sidewalls proceeds while what is called polymer, which is a protection film used for anisotropically etching a layer to be etched, is unevenly deposited on the reverse side of the movable unit 2, which is formed by the local etching. As a result, the reverse side is unevenly protected against the etching ions deflected by the charge built up on the insulator layer 1B. Therefore, the reverse side is unevenly etched to form the jagged protrusions 3.

If the jagged protrusions 3 are formed on the reverse side, the space between the movable unit 2 and the insulator layer 1B may be narrowed or the jagged protrusions 3 may break and plug the gap between the movable unit 2 and the insulator layer 1B. In that case, the movable unit 2 is prevented from moving in response to a force applied to the movable unit 2, and it becomes impossible to measure the force that is correlated to a dynamic quantity by the device 100.

SUMMARY OF THE INVENTION

The present invention has been made in view of the above aspects with an object to prevent jagged protrusions from being formed on the reverse side of a movable unit of a semiconductor device, in which an active layer is located on a supporting substrate with an insulating intermediate layer therebetween and the movable unit moves in relation to the supporting substrate in response to a force applied to the movable unit, which is correlated to a dynamic quantity to be measured by the device.

To achieve the above object, according to the present invention, a method for manufacturing a semiconductor device includes a step of forming an SOI substrate that includes a semiconductor substrate, an insulating layer, and a semiconductor layer such that the insulating layer is located between the semiconductor layer and the semiconductor substrate. The method further includes a step of dry etching the semiconductor layer to form a trench that extends through the semiconductor layer to the insulating layer and a step of dry etching a sidewall defining the trench at a portion adjacent to a bottom of the trench to form a movable unit.

The later dry etching is implemented with a charge building up on a surface of the insulating layer that is exposed during the former dry etching such that etching ions strike and etch the portion of the sidewall. In addition, the later dry etching is implemented at an etching rate higher than that at which the former dry etching is implemented to reduce the deposition amount of a protection film that is deposited on a reverse side of the movable unit during the later dry etching.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF A PREFERRED EMBODIMENT

The present invention will be described in detail with reference to an embodiment.

Figure 3:
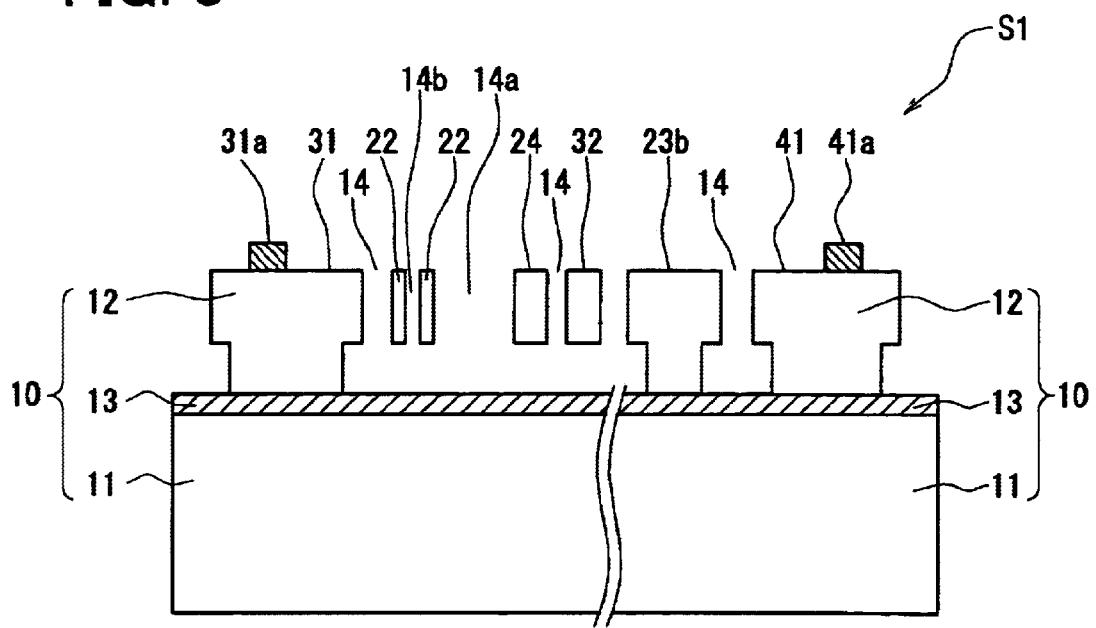
FIG. 3 is a cross-sectional view of the semiconductor acceleration sensor of FIG. 2 taken along lines III—III in FIG. 2.
Figure 2:
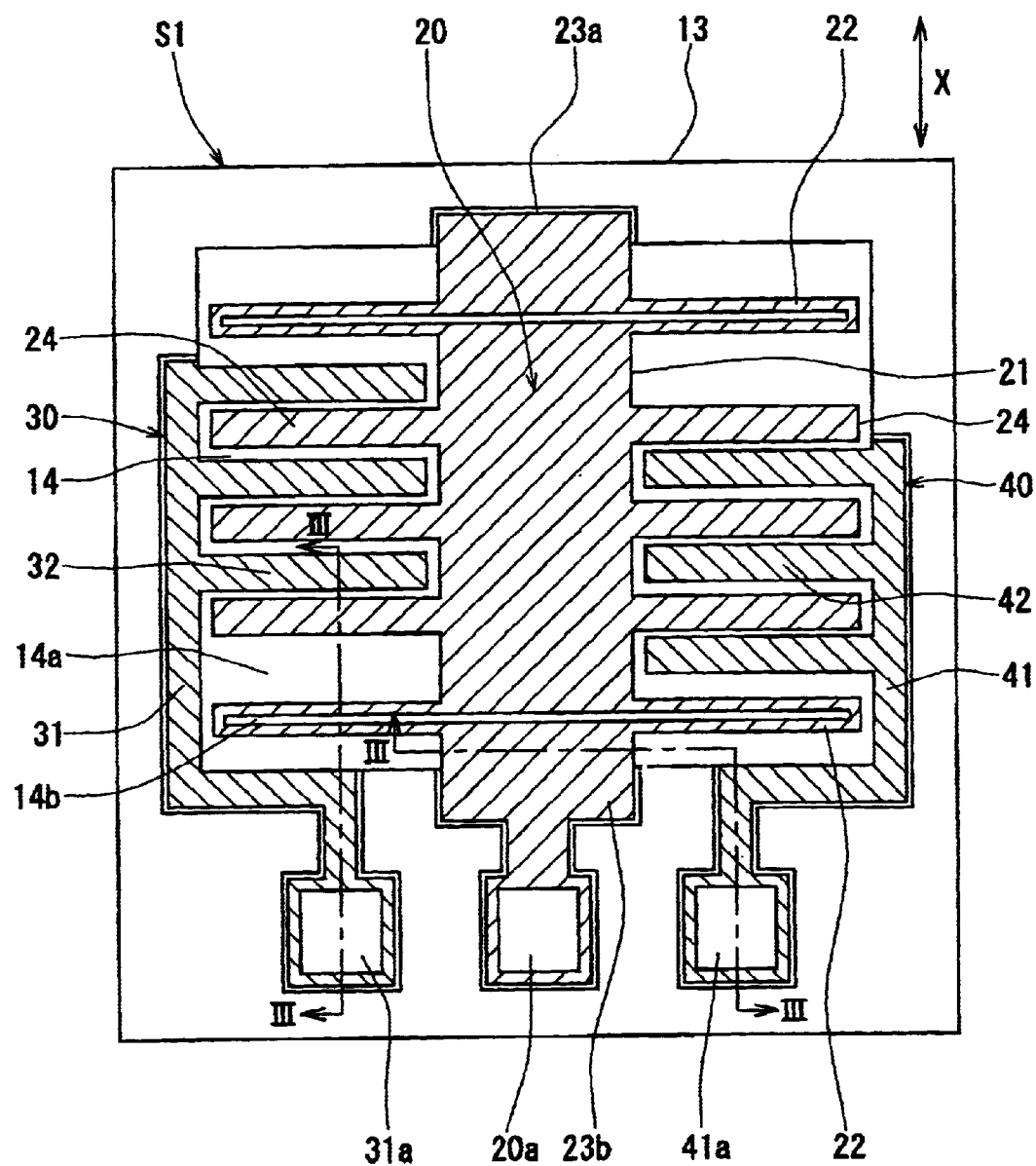
FIG. 2 is a schematic plan view of a semiconductor acceleration sensor that is manufactured using the method according to an embodiment of the present invention.

A semiconductor acceleration sensor S1 shown in FIGS. 2 and 3 can be used as, for example, a sensor for automobiles such as an acceleration sensor and a gyro sensor, which are used for operating the air bag system, the anti-lock break system (ABS), the vehicle stability control (VSC) system, and so on.

As shown in FIG. 3, the semiconductor acceleration sensor S1 includes a substrate 10, which has a Silicon-On-Insulator (SOI) structure. The substrate 10 is composed of an active layer 12, an insulating intermediate layer 13, and a supporting substrate 11. The active layer 12 and the supporting substrate 11 are made of silicon, and the insulating intermediate layer 13 is made of silicon oxide.

As shown in FIGS. 2 and 3, the active layer 12 includes a movable unit 20, two anchors 23a, 23b, and two fixed units 30, 40. The movable unit 20 is composed of a weight 21, two comb-shaped movable electrodes 24, and two rectangular springs 22. The movable electrodes 24 are joined to the weight 21. In addition, the springs 22 are joined to the weight 21 and the anchors 23a, 23b. Therefore, the movable unit 20 moves in relation to the supporting substrate 11 in response to an acceleration of the sensor S1. Each of the fixed units 30, 40 includes a comb-shaped fixed electrode 32, 42. The fixed electrodes 32, 42 are stationary in relation to the supporting substrate 11 under the acceleration of the sensor S1. As shown in FIG. 2, each of the fixed electrodes 32, 42 interleaves with each of the movable electrodes 24 to form two capacitances CS1, CS2.

The anchors 23a, 23b are fixed to the insulating intermediate layer 13, although one of the anchors 23a is not shown in FIG. 3. The movable electrodes 24 and the weight 21 are spaced apart form the insulating intermediate layer 13. That is, the movable unit 20 is suspended between the anchors 23a, 23b. As shown in FIG. 2, each of the rectangular springs 22 includes two beams, which are substantially parallel to each other and connected to each other at its both ends. Each of the rectangular springs 22 functions as a spring to expand and shrink along the directions orthogonal to the longitudinal direction of the beams, or along the directions X of FIG. 2. Therefore, the movable unit 20 moves along the directions X of FIG. 2 when the movable unit 20 is accelerated along the directions X and moves back to the original position when the acceleration becomes zero.

The movable electrodes 24 are respectively located on left and right ends of the weight 21 in FIG. 2. The movable electrodes 24 are mechanically and electrically linked to the weight 21. Therefore, the movable electrodes 24 move with the weight 21 along the directions X in response to the acceleration of the sensor. As shown in FIG. 2, each of the movable electrodes 24 includes three substantially-straight movable electrode beams 24. The left movable electrode beams 24 and the right movable electrode beams 24 jut out in the opposite direction to be orthogonal to the direction X. Each of the movable electrode beams 24 has a rectangular cross-section. Each of the movable electrodes 24 is spaced apart from the insulating intermediate layer 13, as shown in FIG. 3. The distance between each of the movable electrodes 24 and the insulating intermediate layer 13 is, for example, about a few micrometers.

On the other hand, the fixed members 30, 40 are fixed to the insulating layer 13 to be supported by the supporting substrate 11 at the left and right sides thereof in FIG. 2. In FIG. 2, the left fixed unit 30 and the right fixed unit 40 are electrically isolated from each other.

Each of the fixed members 30, 40 also includes a wiring portion 31, 41, at which each of the fixed members 30, 40 is fixed to the insulating layer 13. Each of the fixed electrodes 32, 42 is mechanically and electrically linked to the corresponding wiring portion 31, 41. Each of the fixed electrodes 32, 42 includes three substantially-straight fixed electrode beams 32, 42. As shown in FIG. 2, the left fixed electrode beams 32 and the right fixed electrode beams 42 jut out in the opposite direction to be orthogonal to the direction X. Each of the fixed electrode beams 32, 42 has a rectangular cross-section. Each of the fixed electrodes 32, 42 is spaced apart from the insulating intermediate layer 13, as shown in FIG. 3. The distance between each of the fixed electrodes 32, 42 and the insulating intermediate layer 13 is, for example, about a few micrometers.

As shown in FIG. 2, there is a left clearance between the left movable electrode 24 and the left fixed electrode 32, more specifically between each of the left movable electrode beams 24 and the corresponding left fixed electrode beam 32, and a left capacitance CS1 is formed between the left movable electrode 24 and the left fixed electrode 32. On the other hand, there is a right clearance between the right movable electrode 24 and the right fixed electrode 42, more specifically between each of the right movable electrode beams 24 and the corresponding right fixed electrode beam 42, and a right capacitance CS2 is formed between the right movable electrode 24 and the right fixed electrode 42.

In FIG. 2, each of the left movable electrode beams 24 is located at the lower side of the corresponding left fixed electrode beam 32. On the other hand, each of the right movable electrode beams 24 is located at the upper side of the corresponding right fixed electrode beam 32 in FIG. 2. Therefore, when the movable electrodes 24 move along the directions X in response to a force that acts on the movable unit 20 along the directions X, the capacitances CS1, CS2 change in a manner that one of the capacitances CS1 (CS2) increases while the other CS2 (CS1) decreases. Moreover, the force can be correlated to an acceleration of the sensor S1 along the directions X. Therefore, the acceleration can be measured based on the difference (CS1−CS2) between the capacitances CS1, CS2.

A fixed electrode pad 31a, 41a for wire bonding is located at a predetermined position on each of the wiring portions 31, 41 of the fixed units 30, 40. Each of the fixed electrode pads 31a, 41a is electrically connected to the corresponding fixed electrode 32, 42 through the corresponding wiring portion 31, 41. As shown in FIG. 2, one of the anchors 23b is mechanically and electrically linked to one of the springs 22. A movable electrode pad 20a for wire bonding is located at a predetermined position on the one of the anchors 23b. The movable electrode pad 20a is electrically connected to the movable electrodes 24 through the one of the springs 22 and the weight 21. The electrode pads 20a, 31a, 41a are made of, for example, aluminum.

Although not illustrated in the drawings, the semiconductor acceleration sensor S1 is fixed to a package using, for example, an adhesive pasted at the back side of the supporting substrate 11, or at the side opposite to the insulating layer 13. The package has an electric circuit that is electrically connected to the electrode pads 20a, 31a, 41a with gold or aluminum bonding-wires.

A method for manufacturing the semiconductor acceleration sensor S1, which has a substantially ideal cross-sectional profile shown in FIG. 3, will be described.

Figure 4A:
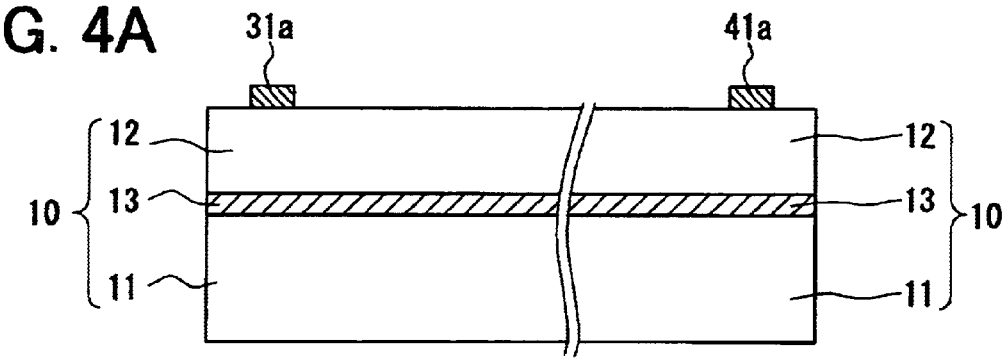
FIGS. 4A to 4D are cross-sectional profiles of the sensor of FIG. 2 at steps of the manufacturing process using the method according to the embodiment.

As shown in FIG. 4A, an SOI substrate 10 that includes a semiconductor substrate 11, an insulating layer 13, and a semiconductor layer 12 is formed such that the insulating layer 13 is located between the semiconductor layer 12 and the semiconductor substrate 11. For example, the SOI substrate 10 may be formed by bonding two silicon single crystal substrates, each of which has (100) face orientation, with a silicon oxide ($SiO_2$) film located therebetween. The two silicon single crystal substrates become the semiconductor substrate 11 and the semiconductor layer 12, respectively. The $SiO_2$ film becomes the silicon oxide layer 13.

Then, an aluminum is deposited on the semiconductor layer 12 by, for example, 1 μm and patterned out into electrode pads 20a, 31a, 41a for wire bonding using photolithography and etching as shown in FIG. 4A, although one of the electrode pad 20a is not illustrated in FIG. 4A.

Next, a masking layer 50 that has openings at the areas where trenches 14, 14a, 14b are formed is made on the semiconductor layer 12. The masking layer 50 may be formed by patterning a photo-resist layer using photolithography. Then, the semiconductor layer 12 is etched through the openings using a plasma dry etching with a charge prevented from building up on a surface of the silicon oxide layer 13 that is exposed during the dry etching in order to form the trenches 14, 14a, 14b. The dry etching can be achieved using, for example, a pulsed frequency bias generated by a low frequency RF power supply, as described later.

Figure 4B:
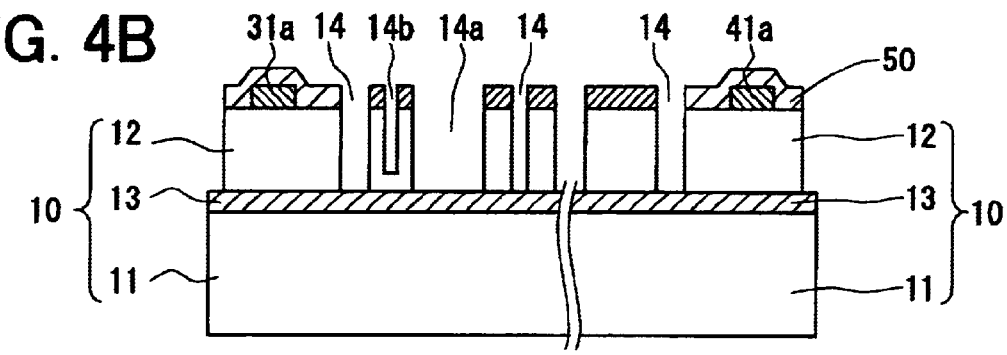
Figure 4C:
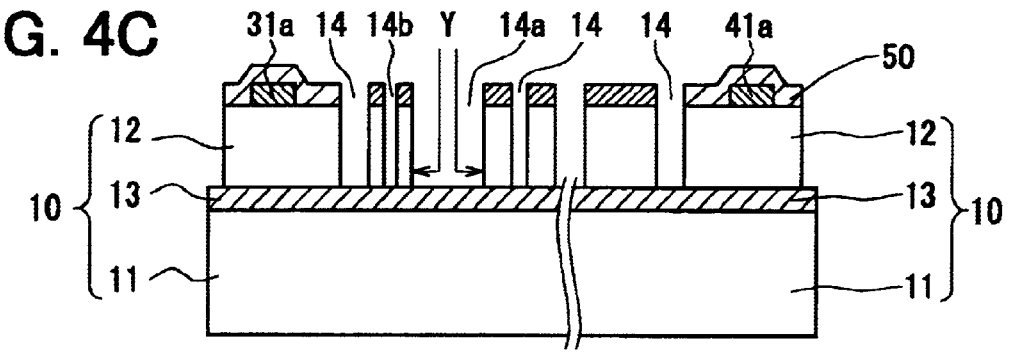
Figure 4D:
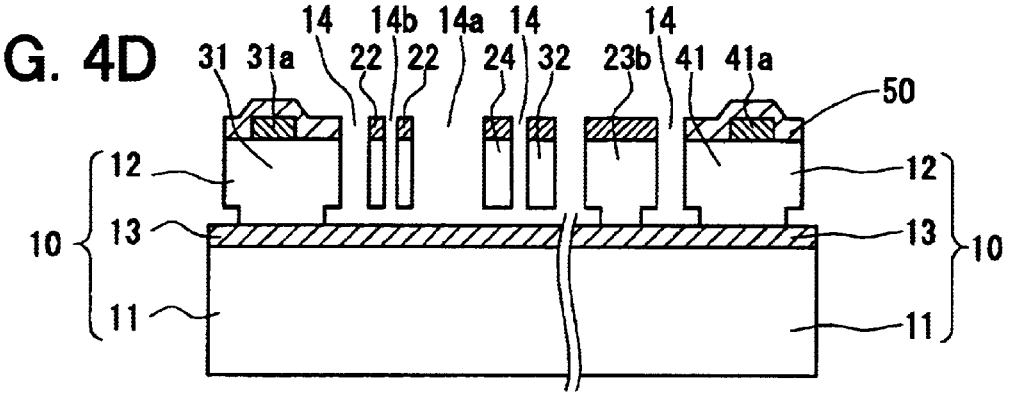

As the dry etching proceeds, a wide trench 14a and other trenches 14 are completed at first, as shown in FIG. 4B. The dry etching is continued further until a narrow trench 14b is finally completed, as shown in FIG. 4C. Then, as shown in FIGS. 4C and 4D, the sidewalls defining the trenches 14, 14a, 14b are dry etched at the portions adjacent to the bottoms of the trenches 14, 14a, 14b with a charge building up on the surface of the insulating layer 13. With the later dry etching, a movable unit 20 and two fixed electrodes 32, 42 are finally formed, as shown in FIG. 4D. The later dry etching can be achieved using, for example, a continuous frequency bias generated by a high frequency RF power supply, as described later.

Inductively coupled plasma (ICP) using gases such as $CF_4$ or $SF_6$ as etching gases or reactive ion etching (RIE) using the same etching gases may be applied to the above two dry etchings, for example. Finally, the masking layer 50 is removed and the semiconductor acceleration sensor S1 of FIGS. 2 and 3 is completed.

The above method for manufacturing the sensor S1 is characterized in that the former dry etching is performed with a charge prevented from building up on the surface of the silicon oxide layer 13 and the later dry etching is performed with a charge building up on the surface of the silicon oxide layer 13.

The former dry etching is performed with a charge prevented from building up on the surface of the silicon oxide layer 13, so it is possible to avoid the localized etching, or "notching", of the sidewalls defining the wide trench 14a until the narrow trench 14b is completed in the former dry etching. It is not necessary that the charge is completely prevented from building up on the surface as long as the "notching" of the sidewalls dose not take place.

In the later dry etching, etching ions generated in the plasma of $CF_4$ or $SF_6$ build a charge up on the silicon oxide layer 13 at the bottoms of the trenches 14, 14a, 14b. The silicon oxide layer 13 is usually charged positively. Therefore, the trajectory angle of the etching ions is changed, as shown by the arrows Y in FIG. 4C. The etching ions strike the sidewalls and locally etch the sidewalls defining the trenches 14, 14a, 14b at the portions adjacent to the bottoms of the trenches 14, 14a, 14b to complete the movable unit 20 and the fixed electrodes 32, 42.

According to the above method, "notching" of the sidewalls defining the trenches 14, 14a, 14b is prevented, so the cross-sectional shape of the springs 22 after the later etching are relatively constant within an etching batch and between etching batches, and so as the performance of the springs 22. That is, machining precision, or dry etching precision, of the springs 22 is relatively excellent. Therefore, the characteristics of the semiconductor acceleration sensor S1, which are manufactured in the above process, are relatively constant between the sensors S1.

Figure 1:
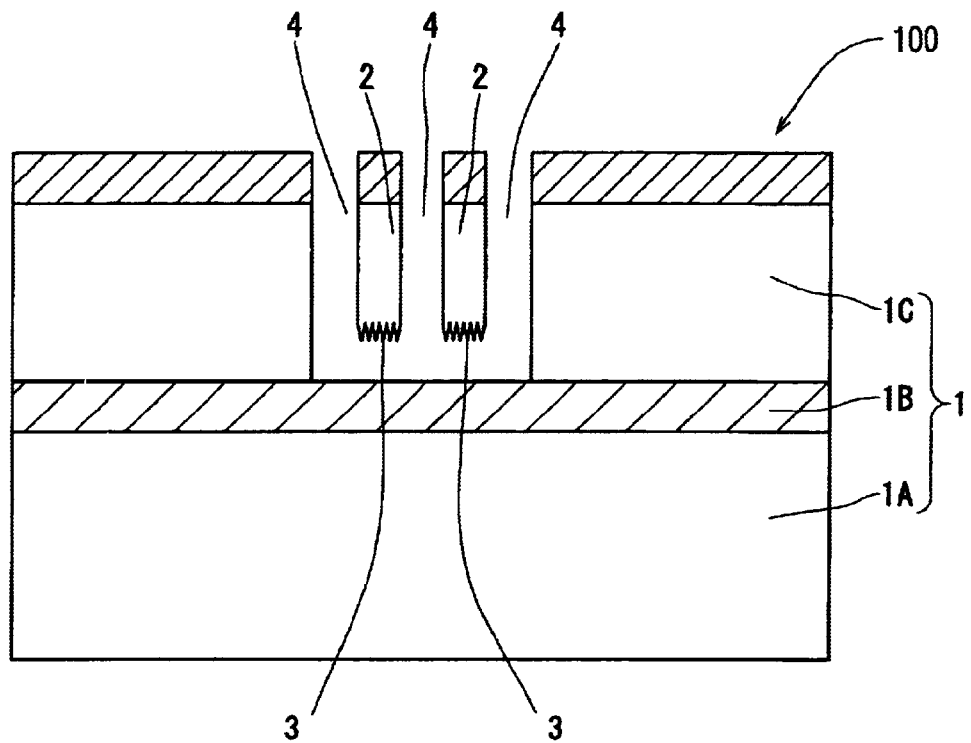
FIG. 1 is a schematic cross-sectional profile of a proposed semiconductor acceleration sensor that is manufactured using a proposed process.

The above method for manufacturing the sensor S1 is further characterized in that the later dry etching is implemented at an etching rate higher than that at which the former dry etching is implemented to reduce the deposition amount of the protection film that is deposited on the reverse side of the movable unit 20 during the later dry etching. Therefore, in the sensor S1 of FIGS. 2 and 3, the jagged protrusions 3, which are formed in the proposed sensor of FIG. 1, are not formed even if the etching ions deflected by the charge built up on the insulator layer 1B strike the reverse side of the movable unit 20.

According to the study conducted by the inventor, it turned out that a too thick protection film is deposited on the reverse side of the movable unit 20 when the later dry etching is implemented under the same etching rate that the former dry etching is done under since the etching rate is suitable forming a thick protection film in order to achieve an anisotropic etching, and the jagged protrusions 3 are formed on the reverse side of the movable unit 20. In addition to that, it turned out that the deposition amount of the protection film that is deposited on the reverse side of the movable unit 20 can be reduced if the later dry etching is implemented at an etching rate higher than that at which the former dry etching is implemented.

The method disclosed in U.S. patent application Ser. No. 6,187,685, For example, may be used to prevent a charge from building up on the surface of the silicon oxide layer 13 in the former dry etching and to build a charge up on the surface of the silicon oxide layer 13 in the later dry etching.

In U.S. patent application Ser. No. 6,187,685, when the bias frequency during dry etching is at or above 5 MHz, more preferably above 10 MHz, the surface of an insulating layer that is located at the bottom of a trench is charged with the following mechanism. Electrons are able to respond to the electric field formed by the frequency bias, so the electrons move isotropically. However, positive etching ions are not able to respond to the electric field, so the moving direction of the positive etching ions is not changed. As a result, positive etching ions are supplied to the surface of the insulating layer more than the electrons. Thus, the surface of the insulating layer is charged. The above frequency bias is achieved using a continuous frequency bias generated by a high frequency RF power supply.

On the other hand, when the bias frequency during the dry etching is below 5 MHz, more preferably below 600 kHz, no charge builds up on the surface of an insulating layer that is located at the bottom of a trench with the following mechanism. Both electrons and etching ions are able to respond to an applied electric field, so the electrons and the etching ions move anisotropically. As a result, the amount of the electrons that reach the surface of the insulating layer is substantially equal to that of the etching ions that reach the surface of the insulating layer. Thus, the surface of the insulating layer is not charged. The later frequency bias is achieved using a pulsed frequency bias generated by a low frequency RF power supply.

In the method for manufacturing the semiconductor acceleration sensor S1 as well, it is possible to prevent a charge from building up on the surface of the silicon oxide layer 13 in the former dry etching in order to form the trenches 14, 14a, 14b without causing "notching" on the sidewalls thereof as shown in FIGS. 4B and 4C, if the bias frequency below 5 MHz, more preferably below 600 kHz, is used. On the other hand, it is possible to build a charge up on the surface of the silicon oxide layer 13 in the later dry etching in order to complete the movable unit 20 and the fixed electrodes 32, 42, if the bias frequency at or above 5 MHz, more preferably above 10 MHz is used.

The present invention is not limited to the above method for manufacturing the semiconductor acceleration sensor S1 and may be variously applied. For example, the present invention may also be applied to methods for manufacturing other sensors such as a pressure sensor and an angular velocity sensor.

In the semiconductor acceleration sensor S1, as shown in FIG. 3, the fixed electrodes 32, 42 are completely separated from the silicon oxide layer 13. However, the fixed electrodes 32, 42 may be joined to the silicon oxide layer 13. The fixed electrodes 32, 42 that are joined to the silicon oxide layer 13 can be formed, for example, by widening the fixed electrodes 32, 42 than the movable electrodes 24 such that the fixed electrodes 32, 42 are not separated from the silicon oxide layer 13 after the movable unit 20 are completed by dry etching.

What is claimed is:

1. A method for manufacturing a semiconductor device, in which an active layer is located on a supporting substrate with an insulating intermediate layer therebetween and a movable unit included in the active layer moves in relation to the supporting substrate in response to a force applied to the movable unit, wherein the force is correlated to a dynamic quantity to be measured by the device, the method comprising steps of:

forming an SOI substrate that includes a semiconductor substrate, an insulating layer, and a semiconductor layer such that the insulating layer is located between the semiconductor layer and the semiconductor substrate;

dry etching the semiconductor layer to form a trench that extends through the semiconductor layer to the insulating layer;

dry etching a sidewall defining the trench at a portion adjacent to a bottom of the trench to form a movable unit, wherein the later dry etching is implemented with a charge building up on a surface of the insulating layer that is exposed during the former dry etching such that etching ions strike and etch the portion of the sidewall and wherein the later dry etching is implemented at an etching rate higher than that at which the former dry etching is implemented to reduce the deposition amount of a protection film that is deposited on a reverse side of the movable unit during the later dry etching.

* * * * *